US005349623A

United States Patent [19]

Itoh

[11] Patent Number: 5,349,623

[45] Date of Patent: Sep. 20, 1994

[54] DRIVING CIRCUIT FOR EXOTHERMIC RESISTORS

[75] Inventor: Hiroshi Itoh, Hyogo, Japan

[73] Assignee: Mitsubishi Denki Kabushiki Kaisha, Tokyo, Japan

[21] Appl. No.: 956,410

[22] Filed: Oct. 5, 1992

[30] Foreign Application Priority Data

Oct. 14, 1991 [JP] Japan .................................. 3-292039

[51] Int. Cl.[5] ....................... H03K 19/082; H03K 3/01

[52] U.S. Cl. ................................ 377/75; 346/76 PH; 307/270; 307/242; 307/463

[58] Field of Search ....................... 307/270, 242, 463; 377/75; 346/76 PH

[56] References Cited

U.S. PATENT DOCUMENTS 4,568,817 2/1986 Leng et al. ..................... 346/76 PH 4,779,102 10/1988 Sasaki ............................ 346/76 PH

FOREIGN PATENT DOCUMENTS 63-218375 9/1988 Japan .

2269064 11/1990 Japan .

371859 3/1991 Japan .

*Primary Examiner*—Margaret Rose Wambach

*Attorney, Agent, or Firm*—Rothwell, Figg, Ernst & Kurz

[57] ABSTRACT

A driving circuit for driving driven elements such as exothermic resistors for a thermal head is disclosed, in which there are provided a signal information supply means for supplying signal information for driving driven elements independent of the driving information, and switching elements which operate switching operations for making the adjacent ones operate opposing logic operations to each other according to the driving periods of time decision signals.

18 Claims, 15 Drawing Sheets

EXOTHERMIC RESISTOR POSITION
(EXOTHERMIC RESISTOR CONSTITUTION SHOWN IN FIG. 17 DRIVEN BY A DRIVING CIRCUIT SHOWN IN FIG. 12)

( EXOTHERMIC RESISTOR CONSTITUTION SHOWN IN FIG. 17 DRIVEN BY A DRIVING CIRCUIT SHOWN IN FIG.12 )

DRIVING CIRCUIT FOR EXOTHERMIC RESISTORS

BACKGROUND OF THE INVENTION

1. Field of the Invention

The present invention relates to a driving circuit for driving elements such as exothermic resistors of a thermal head.

2. Description of the Prior Art

FIG. 1 is a circuit diagram showing a conventional driving circuit. In FIG. 1 are N exothermic resistors of a thermal head as driven elements, and Block 2 is a driving circuit for driving these N exothermic resistors marked 1 on the diagram, supplying each of them driving information individually.

In driving circuit 2, objects marked 3 are NAND gates which act as switching elements and are provided corresponding to the respective N exothermic resistors. Part 4 are shift registers for shifting the serial signal information to be the driving information for the exothermic resistors 1 inside it in synchronization with a clock signal, and 5 are latch circuits as holding means for holding the contents of the shift registers 4 according to a specified latch signal.

Part 6 is an input terminal for inputting the signal information serially to the shift registers 4 and 7 is a clock signal terminal from which the clock signal for the shift registers 4 is to be input. The points marked 8 are output terminals from which the signal information which is shifted inside the shift registers 4 is to be output, and 9 is a latch terminal from which a latch signal is to be input to the latch circuits 5. Part 10 is a strobe terminal to which a strobe signal to the NAND circuits 3 is to be input, 11 is a BEO terminal to which a negative enable output (hereinafter referred to as BEO) to the NAND circuits 3 is to be input, and 12 is a common electrode to which each of the exothermic resistors 1 is commonly connected.

FIG. 2 is a circuit diagram of a thermal head which is an example of an electronic part actually constituted based on the circuit shown in FIG. 1. In the figure point 13 are L pieces of integrated circuits (hereinafter referred to as ICs) which constitute the driving circuit 2, and each of them is constituted with N/L (the number of the exothermic resistors 1 N, divided by the number of IC's 13 marked L) NAND circuits, N/L stage shift registers and N/L latch circuits, and the IC's are connected in series with respective input terminals 6 and output terminals 8.

When a thermal head is, for example, of an A4 size of 8 bits per mm which is generally used in facsimile, etc., the total number of exothermic resistors 1 is 1723 and the total number of stages of the shift registers 4 is 1728, and when the constitutional unit of an IC 13 is assumed to be 64 bits, then it is found that 27 pieces of IC's 13 are connected. When split printing is to be performed, strobe terminals 10 and BEO terminals 11 of a number of systems corresponding to respective groups of IC's 13, composed of several pieces of IC's 13 have to be introduced.

Part 14 is a power supply terminal through which power is to be supplied to the IC's 13, and 15 is a terminal to be connected to the ground. The other points are similar to those shown in FIG. 1 so that the explanation of them will be omitted.

Next, the operation will be explained. The thermal head mentioned in the above is a main part of an apparatus of a thermosensible recording system, and recently the recording system has been widely utilized because of its simplicity. In the thermal head, numerous exothermic resistors are arranged on a substrate, and these resistors are selectively energized and the part of the printing paper which is pressed against an energized resistor is colored and printed. There are many kinds of driving systems and typical examples will be explained in the following.

The signal information for driving the exothermic resistors 1 is input to the shift registers 4 from the input terminal 6 in series, and it is shifted in order inside the shift registers 4 in synchronization with the clock signal given through the clock signal terminal 7. When the signal information for one line is input to the shift registers 4, a latch signal is input to the latch terminal 9 for the latch circuits 5, and data is transferred to the latch circuits 5 which hold the contents of the shift registers 4 according to the latch signal. The reason why the shift registers and the latch circuits are constituted as described in the above is to make it possible to transfer the signal information during the driving of exothermic resistors 1. The contents of the latch circuits 5 become the driving information for the exothermic resistors 1.

Each switching element 3 (NAND circuit) corresponding to each of the exothermic resistors 1 executes switching operation based on a strobe signal input to the strobe terminal 10, a BEO signal input to the BEO terminal 11 and the signal logic state of the driving information held in the latch circuit 5. In other words, the period of time during which the strobe signal is in an L level and the BEO signal is in an H level is the driving period of time for an exothermic resistor 1. The strobe signal and the BEO signal function respectively as decision signals for deciding the driving period time for exothermic resistors 1.

The reason why the operation logic of a strobe signal is made to be opposite to that of a BEO signal is to prevent an erroneous operation in a period of time of signal instability which can occur in a case of ON/OFF operation of the power supply in an apparatus using such a thermal head as mentioned in the above. The erroneous operation of a thermal head in the case of ON/OFF operation of the power supply can be prevented, for example, by making a BEO signal the detection signal of a voltage detector circuit of the power supply circuit.

FIG. 3 is a timing chart showing the operation of the driving circuit shown in FIG. 1. In the figure, COMMON is a voltage to be input to the common electrode 12, and may be 12V, 24V, etc., for example. DATA is signal information to be input to the input terminal 6, CLOCK is a clock signal to be input to the clock terminal 7, LATCH is a latch signal to be input to the latch terminal 9, BEO is a BEO signal to be input to the BEO terminal 11 and STROBE is a strobe signal to be input to the strobe terminal 10. A thermal head records an image on thermosensible paper by selectively energizing exothermic resistors 1, and the energizing time is adjusted depending on the ambient temperature or the temperature of a thermal head itself to upgrade image quality. Normally, the energizing time is controlled to be long when the temperature is low and to be short when the temperature is high. There is also a control method in which the temperature of a thermal head itself is raised by making a current flow in all exothermic resistors 1, the current which is not so large as to record an image on a thermosensible paper in a waiting time for preventing degradation of image quality caused by an insufficient energizing period of time in a low ambient temperature.

An example of a timing chart of an apparatus having the control method as mentioned in the above is shown in FIG. 4. As shown in the figure, an exothermic resistor 1 is energized in the period of time obtained by adding a period of time of "data-on by the driving information" to a period of time of "preheating by the signal information" for all black data. In this case, considering a countermeasure against electromagnetic interference (hereinafter referred to as EMI), it is desirable to make the transmission velocity of a clock signal lower than 500 kHz.

Since a conventional driving circuit is constituted as described in the above, there are problems as shown in the following: it is necessary to transmit signal information for preheating when the ambient temperature is low, and a printing velocity is decided by the transmission velocity of a clock signal. Also, degradation of picture quality is caused by the increase in heat accumulated by energizing the adjacent exothermic resistors 1 for preheating, and picture quality is degraded by heat conductance to adjacent exothermic resistors 1 when a continuous exothermic resistor 1 is formed with a thick film in a belt shape.

SUMMARY OF THE INVENTION

One object of the present invention is to offer a driving circuit in which there is no need to transmit signal information for preheating.

Another object of the present invention is to offer a driving circuit in which an erroneous operation in the period of time of signal instability can be prevented. An erroneous operation may occur when switching the power supply ON/OFF.

A further object of the present invention is to offer a driving circuit in which there is little degradation in image quality. Image quality degradation is caused by heat accumulation or heat conduction.

A still further object of the present invention is to offer a driving circuit in which there is no need to supply an FCON signal from the exterior.

An additional object of the present invention is to offer a driving circuit in which a safety measure can be taken if connecting cable breaks.

In order to achieve the above-mentioned, a driving circuit according to a first aspect of the present invention is provided with a signal supply means for supplying signal information for driving driven elements to switching elements independent of the driving information held in a holding means.

The signal information supply means in the first aspect of the present invention realizes a driving circuit in which the transmission of the signal information for preheating is not needed, by supplying signal information for driving driven elements independent of the driving information held in the holding means.

A driving circuit according to the second aspect of the present invention decides a driving period of time for driven elements with at least 2 kinds of signals for deciding driving period of time, which perform logic operations being opposite to each other.

Therefore at least 2 kinds of signals for deciding the driving period of time in the second aspect of the present invention, which prevent erroneous operation during an unstable signal period of time during an ON/-OFF operation of the power supply.

A driving circuit according to a third aspect of the present invention uses switching elements which operate switching operations so that the adjacent ones operate reverse logic operations to each other according to the signals for deciding driving periods of time, and drive driven elements corresponding to the driving information from the holding means.

The switching elements according to the third aspect of the present invention realize a driving circuit in which degradation in image quality is prevented in avoiding simultaneous heating of the adjacent driven elements by performing the switching operation so that the adjacent ones can perform reverse logic operations to each other according to the signals for deciding driving periods of time.

A driving circuit according to the fourth aspect of the present invention has a signal for deciding the driving period of time which is a pulse signal having a logic state in which adjacent driven elements are not driven simultaneously.

A signal for deciding a driving period of time in the fourth aspect of the present invention prevents degradation in image quality by arranging the logic state of a pulse signal not to drive the adjacent driven elements simultaneously.

A driving circuit according to the fifth aspect of the present invention uses Switching elements which operate switching operations so that the adjacent ones can perform reverse logic operations to each other according to the signals for deciding driving periods of time, and is provided with a signal information supply means for supplying signal information for driving elements to the switching elements independent of the driving information.

The switching elements according to the fifth aspect of the present invention realizes a driving circuit which prevents degradation in image quality in preventing simultaneous heating of the adjacent driven elements in performing switching operations so that the adjacent ones can operate reverse logic operations to each other according to the signals for deciding the periods of time.

In a driving circuit according to the sixth aspect of the present invention, driven elements are divided into groups so that the adjacent driven elements are not incorporated in the same group and switching elements are used which operate switching operations according to the signals for deciding driving periods of time for respective groups, and a signal information supply means for supplying signal information for driving elements to the switching elements independent of the driving information.

The switching elements according to the sixth aspect of the present invention realizes a driving circuit in which driven elements are divided into groups so that the adjacent driven elements are not incorporated in the same group and the adjacent driven elements are arranged not to be heated simultaneously by the switching operations according to the signals for deciding the periods of time for respective groups, and the degradation in image quality is prevented.

A driving circuit according to the seventh aspect of the present invention is provided with a pulse generation means for generating a pulse signal for deciding a signal for deciding the driving period of time based on the logic state of the pulse signal.

The pulse generation means in the seventh aspect of the present invention dispenses with the supply of an FCON signal from the exterior; as a signal for deciding a driving period of time, by deciding a driving period of time for driven elements based on the logic state of a generated pulse signal.

In a driving circuit according to the eighth aspect of the present invention a resistor is connected between the input terminal for the signal information and the power supply terminal or the grounding terminal according to the logic state of the signal information from the signal information supply means.

The resistor in the eighth aspect of the present invention is provided for the purpose of safety measures when a connecting cable is broken and is connected between the input terminal of the signal information and the power supply terminal or the grounding terminal according to the logic state of signal information from the signal information supply means.

The above-mentioned objects and other objects, and new features will be clearly understood after reading the detailed explanation described in the following referring to the drawings attached. The figures, however, are for solely illustrative purposes, and they do not limit the scope of the present invention.

DETAILED DESCRIPTION OF THE PREFERRED EMBODIMENTS

Embodiment 1

Figure 1:
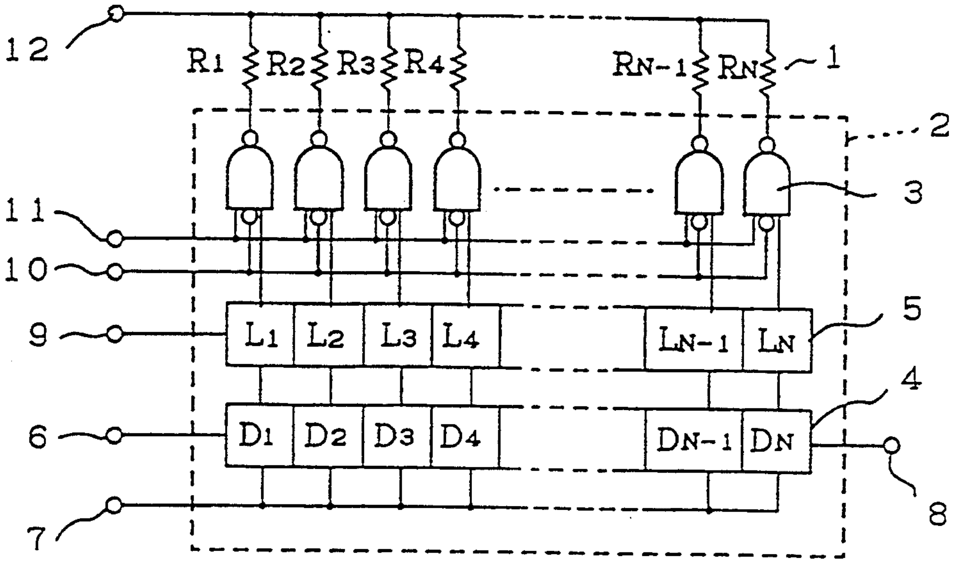
FIG. 1 (PRIOR ART)
FIG. 1 is a circuit diagram showing a conventional driving circuit.
Figure 2:
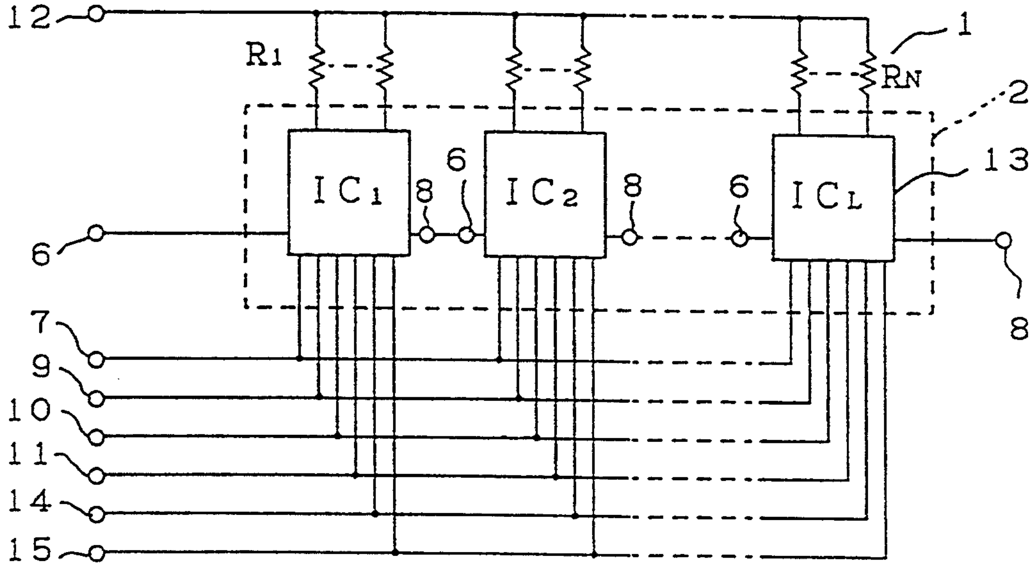
FIG. 2 (PRIOR ART)
FIG. 2 is a circuit diagram showing a thermal head as an electronic part realized in a conventional driving circuit.
Figure 3:
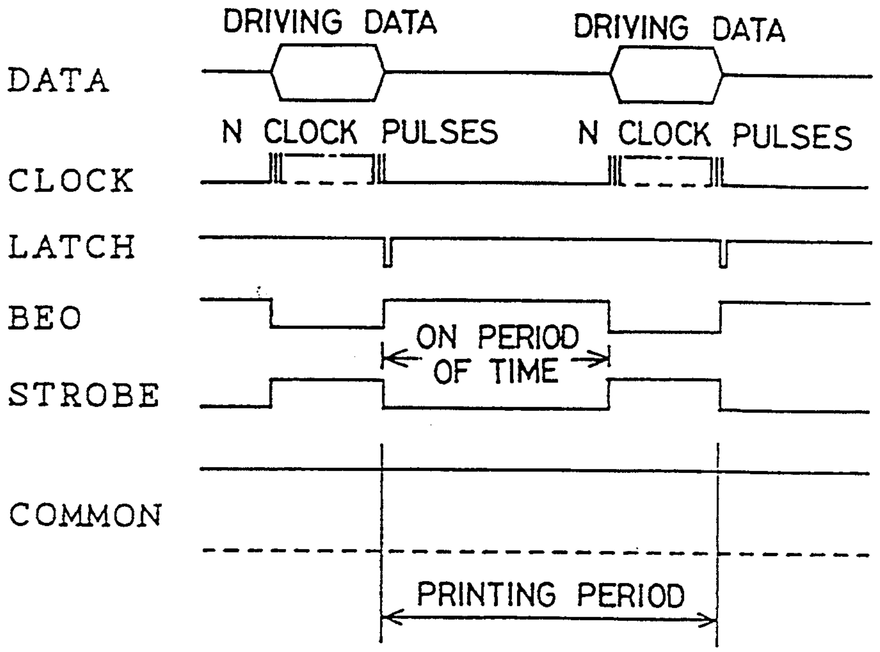
FIG. 3 (PRIOR ART)
FIG. 3 is a timing chart showing the operation of the thermal head shown in FIG. 2.
Figure 4:
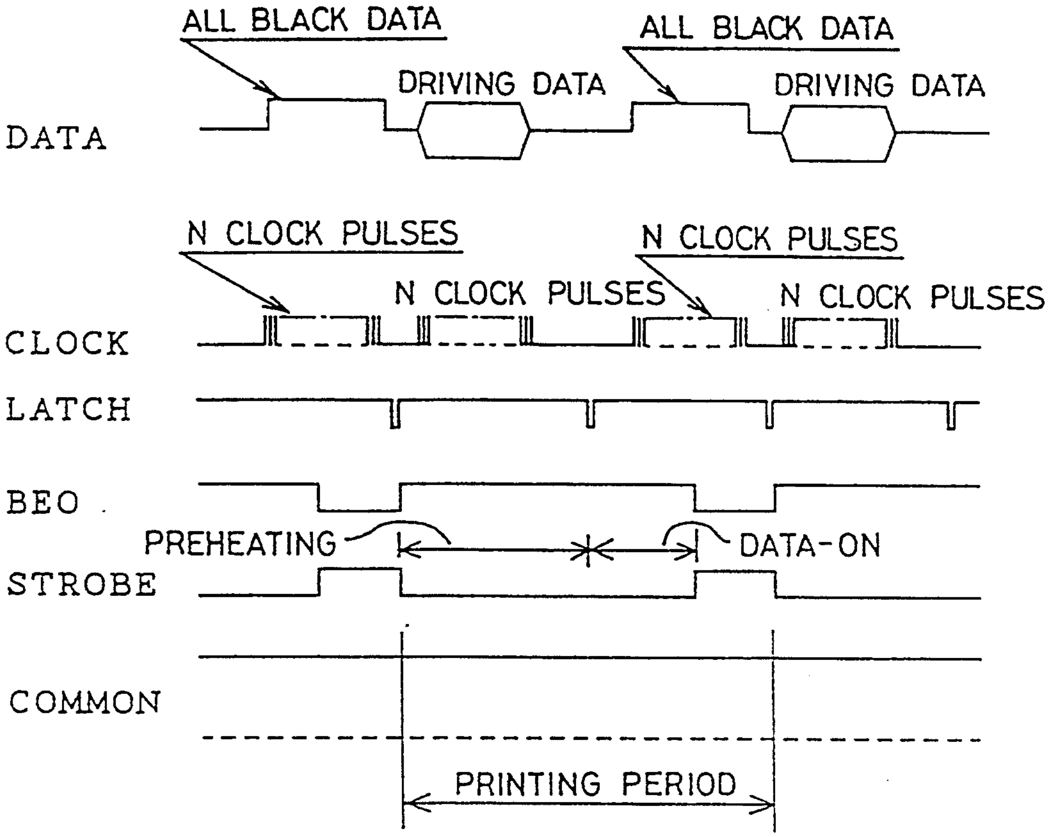
FIG. 4 (PRIOR ART)
FIG. 4 is a timing chart showing the preheating operation.
Figure 5:
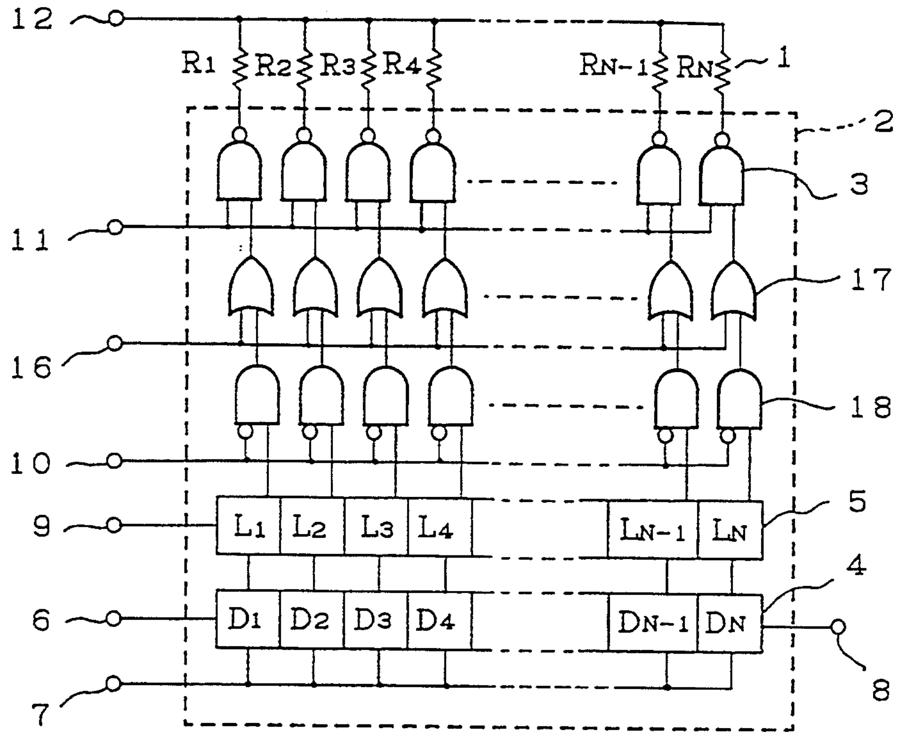
FIG. 5 is a circuit diagram showing an embodiment according to the present invention.

The embodiment 1 according to the present invention will be explained based on the drawings in the following. FIG. 5 is a circuit diagram showing an embodiment in the first and the second aspects of the present invention. In the figure, 1 are exothermic resistors used as driven elements, 2 is a driving circuit, 3 are NAND circuits used as switching elements, 4 are shift registers, 5 are latch circuits for holding data, 6 is an input terminal, 7 is a clock pulse terminal, 8 is an output terminal, 9 is a latch terminal, 10 is a strobe terminal, 11 is a BEO terminal, and 12 is a common electrode; the elements given with the same symbols as those shown in FIG. 1 are the same as or equivalent to the conventional elements shown in FIG. 1, so that detailed explanation of these elements will be omitted.

Element 16 is an all-on terminal to which an all-on signal is input which is the signal information for driving the exothermic resistors independent of the driving information held in the latch circuits 5, 17 is an OR circuit which ORs the all-on signal with the driving information, and transmits it to the NAND circuits 3, and 18 is an AND circuit which gates the driving information held in the latch circuits 5 with a reverse signal of a strobe signal and inputs it to the OR circuit 17. Therefore, in this case, the NAND circuits 3 are gated by only the BEO signal.

Next, the operation will be explained. The operations of the shift registers 4 and the latch circuits 5 are similar to those of the conventional case. When the all-on signal to be input to the all-on terminal 16 becomes an H level, the output of each OR circuit becomes an H level independent of the driving information output from each of the latch circuits 5. Therefore, during the period of time in which BEO signal is in an H level, the output of each NAND circuit 3 becomes L level; thereby the voltage applied by the common electrode 12 makes currents flow through the exothermic resistors.

As described in the above, the period of time during which both all-on signal and BEO signal are in an H level is the preheating time; when printing is to be performed based on the driving information held in the latch circuits 5, the printing can be executed with the same operation as the conventional one by making the all-on signal be in an L level. In other words, the switching between preheating and data-on is made possible by a logic state of an all-on signal.

Embodiment 2

Figure 6:
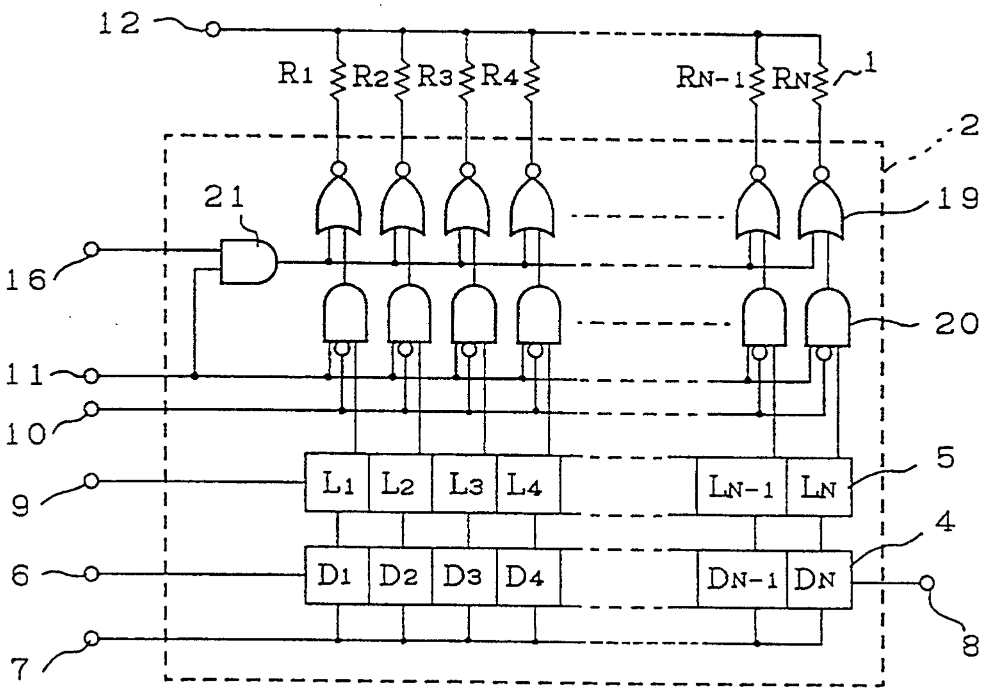
FIG. 6 is a circuit diagram showing an embodiment according to the present invention.

FIG. 6 is a circuit diagram showing another embodiment in the first and the second aspects of the present invention; the same symbols are given to the parts which are the same as those shown in FIG. 1, and the explanation for them will be omitted. In the figure, 19 are NOR circuits for use as switching elements, and 20 are AND circuits which input driving information from the latch circuits 5, a reverse signal of a strobe signal, and a BEO signal. Element 21 is an AND circuit as a signal information supply means which ORs an all-on signal with a BEO signal and transmit it to respective NOR circuits 19.

Since the basic operation is similar to that of embodiment 1, its explanation will be omitted; however, a different point from embodiment 1 is that a 2 stage constitution of an AND circuit 20 and a NOR circuit 19 is adopted in place of a 3 stage constitution of an AND circuit 18, an OR circuit 17 and a NAND circuit 3, and the circuit construction is simplified by using an AND circuit 21 in which an all-on signal and a BEO signal are ANDed.

The driving circuit 2 is made to be an IC and the improvement of yield is requested, so that the simplification of the circuit is desired.

Figure 7:
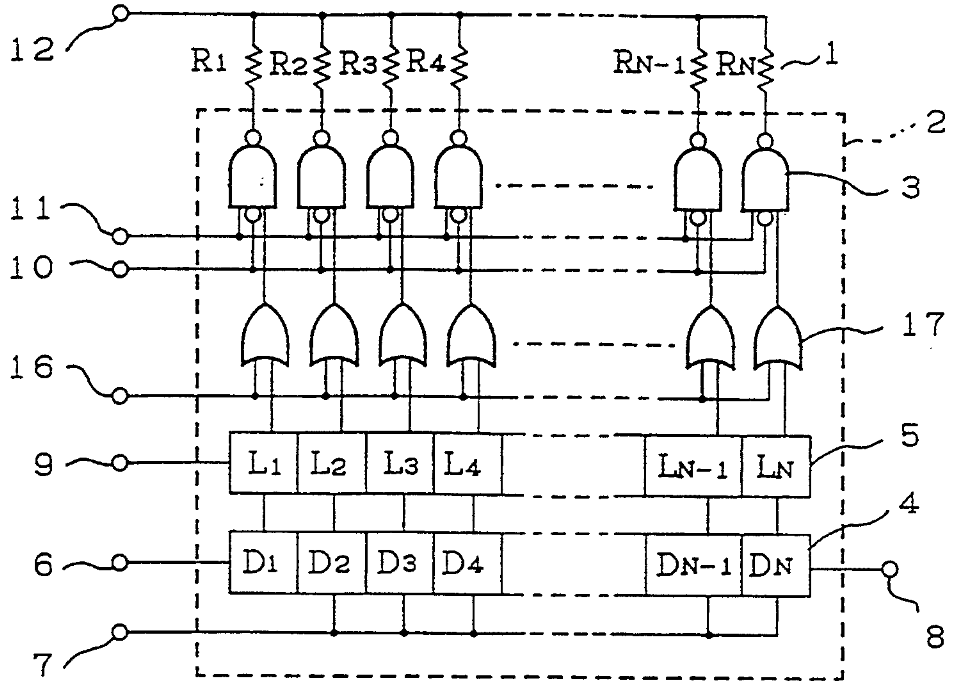
FIG. 7 is a circuit diagram showing an embodiment according to the present invention.

FIG. 7 is a circuit diagram showing a further embodiment in the first and the second aspects of the present invention, and the same symbols are given to the parts corresponding to those in FIG. 5, therefore the explanation of them is omitted. In the third embodiment, the driving information held previously in the latch circuits 5 by the OR circuit 17 is ORed with an all-on signal, and the output, the reverse signal of the strobe signal and a BEO signal are transmitted to the NAND circuits 3 for executing the switching between preheating and data-on.

Embodiment 4

Figure 8:
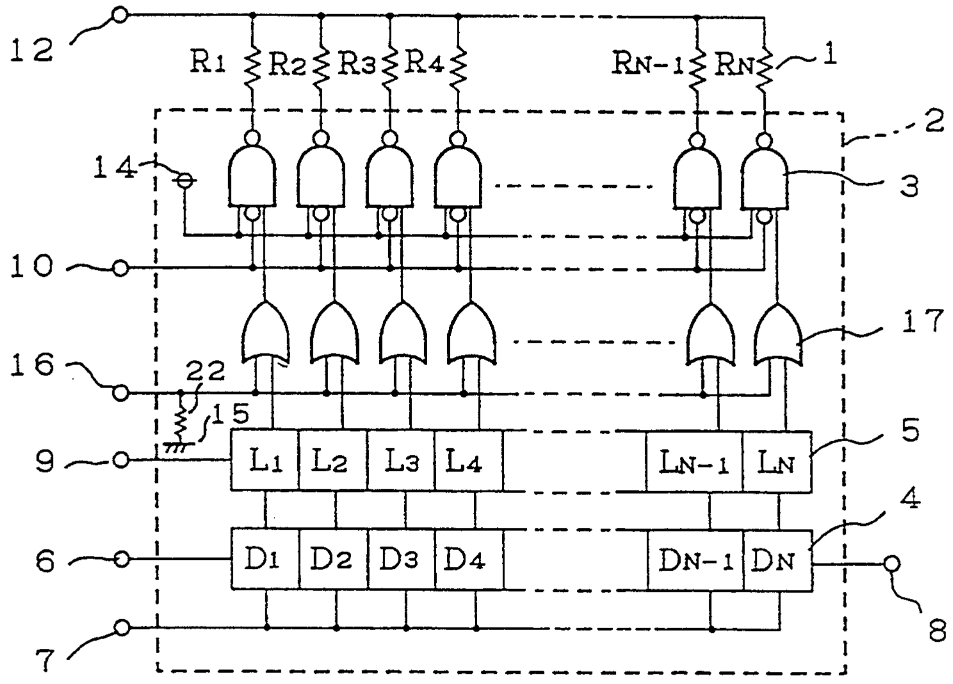
FIG. 8 is a circuit diagram showing an embodiment according to the present invention.

FIG. 8 is a circuit diagram showing an embodiment in the eighth aspect of the present invention, and the BEO signal circuit in the third embodiment is connected to the power supply terminal 14 in the driving circuit 2 and an all-on signal circuit is connected to the grounding terminal 15 through a pull-down resistor 22 in the driving circuit 2.

In the circuit constitution as described in the above, at both building-up and last transition of the power supply voltage, the BEO signal is changed, so that a signal supply from a power supply voltage detector circuit during the ON/OFF switching of the power supply circuit is not needed. When the connecting cable for the all-on signal from the exterior is broken, the all-on signal becomes an L level, and therefore serves as a safety measure for the breakage of a connecting cable.

In the case of FIG. 8, when the signal logic of an all-on signal is in an H level, preheating is executed; however, in contrast with this, a circuit constitution, in which preheating is executed when a signal logic is in an L level, is also possible. In this case, a safety measure can be devised by connecting the all-on signal circuit to the power supply terminal 14 through the pull-up resistor 22.

A safety measure in case of breakage of a connecting cable can be also devised by connecting the strobe signal circuit to the grounding terminal 15 or to the power supply terminal 14 through a pull-down resistor, or by connecting a BEO signal circuit to the grounding terminal 15 or to the power supply terminal 14 through a pull-up resistor, inside a thermal head.

Embodiment 5

Figure 9:
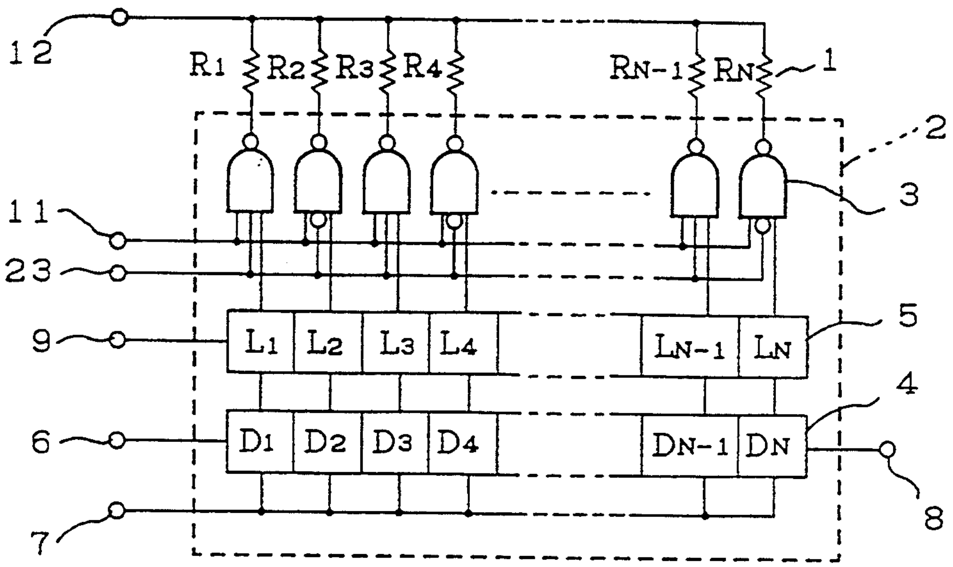
FIG. 9 is a circuit diagram showing an embodiment according to the present invention.

FIG. 9 is a circuit diagram showing an embodiment of the third and the fourth aspects of the present invention, and the same symbols are given to the elements which are similar to those in FIG. 1 and hence a repeated explanation is avoided. In the figure, 23 is an FCON terminal to which an FCON signal is input as a signal for deciding the driving period of time which is to be input to the NAND circuit 3 in place of a conventional strobe signal.

The FCON signal input to each NAND circuit 3 is reversed for every other input, so that by making the FCON signal input from the FCON terminal 23 an intermittent pulse input, it can be arranged so that when the FCON signal is in an H level, the exothermic resistors 1 of odd numbers [R1, R3, . . . R(N−1)] are switched on, and when the FCON signal is in an L level, the exothermic resistors 1 of even numbers (R2, R4, . . . RN) are switched on; thereby adjacent exothermic resistors 1 are not driven simultaneously.

Embodiment 6

Figure 10:
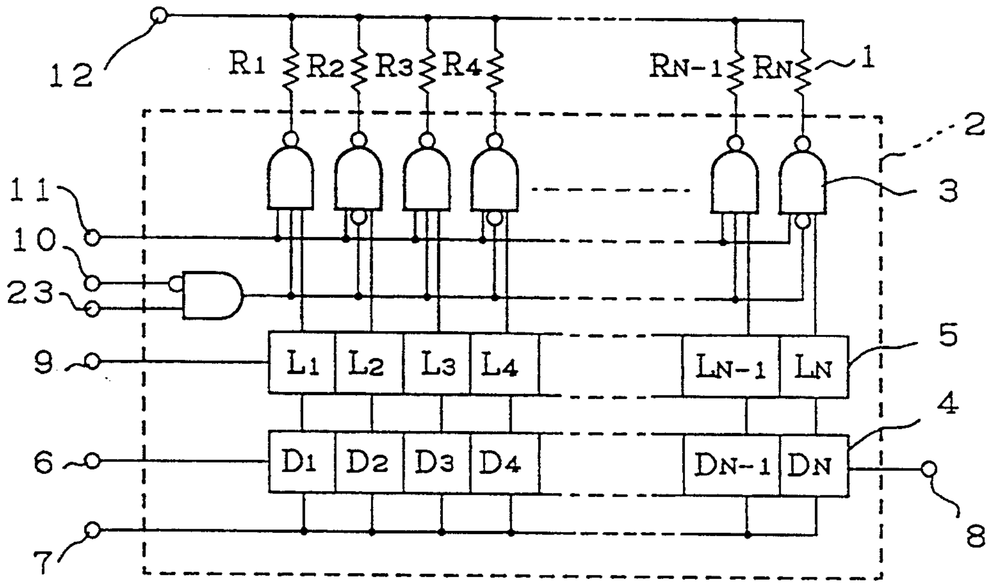
FIG. 10 is a circuit diagram showing an embodiment according to the present invention.

FIG. 10 is a circuit diagram showing an embodiment in which a strobe signal is incorporated which does not exist in embodiment 5 being replaced with an FCON signal, and continuous oscillation pulses are supplied as an FCON signal and adjacent exothermic resistors are arranged not to be simultaneously switched on similar to the embodiment 5 being controlled with a strobe signal and a BEO signal similar to a conventional case.

Embodiment 7

Figure 11:
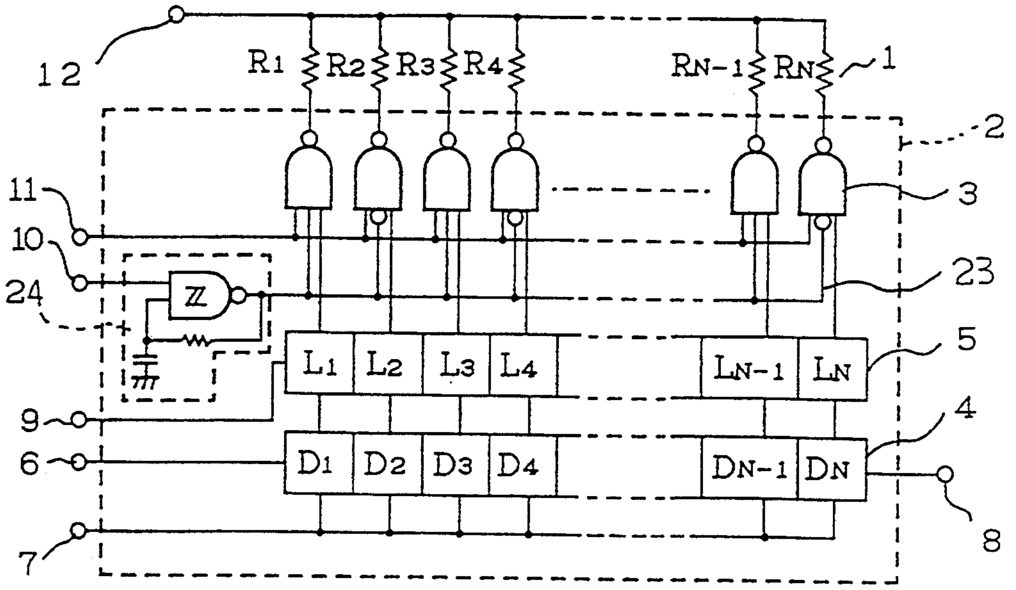
FIG. 11 is a circuit diagram showing an embodiment according to the present invention.

FIG. 11 is a circuit diagram showing an embodiment in the seventh aspect of the present invention, and in order to eliminate the supply of an FCON signal from the exterior as in the case of the embodiment 5 or 6, a pulse oscillator 24 is incorporated in the driving circuit 2 as a way of producing a pulse generation. Due to this, similar to a conventional case, the adjacent exothermic resistors 1 are not simultaneously switched on by supplying only a strobe signal and a BEO signal.

Embodiment 8

Figure 12:
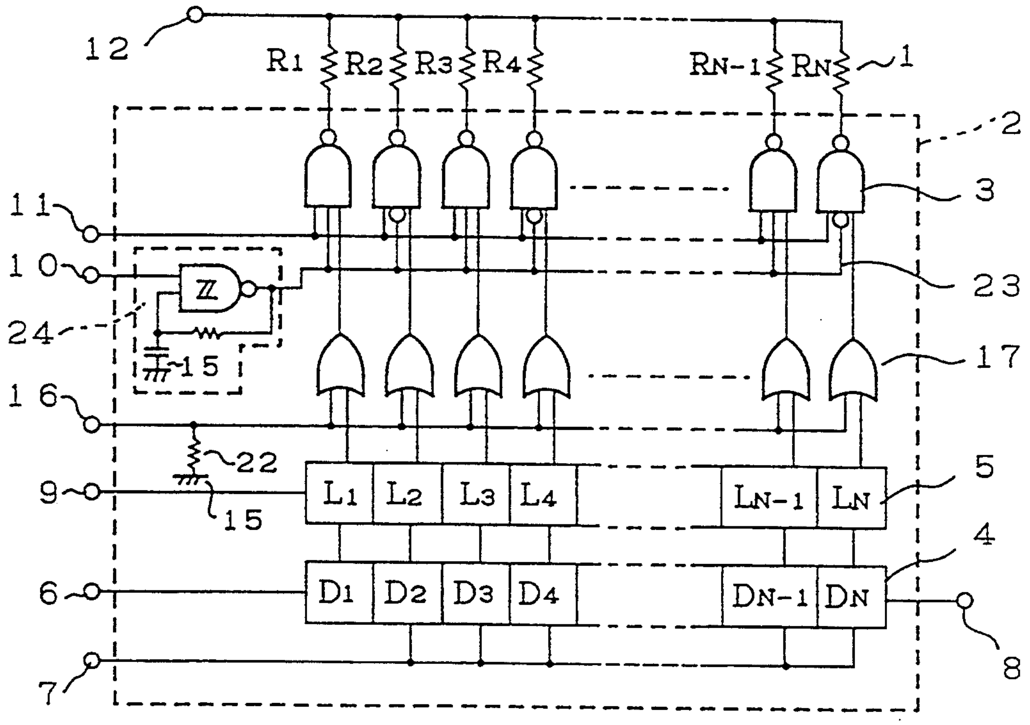
FIG. 12 is a circuit diagram showing an embodiment according to the present invention.

FIG. 12 is a circuit diagram showing an embodiment in the fifth aspect of the present invention, and there are provided in the circuit, the OR circuits 17 which function as signal information supply means for supplying an all-on signal, which drives exothermic resistors 1 independent of the driving information held in the latch circuits 5, to the NAND circuits 3 which function as switching elements, and the NAND circuits 3 which function as switching elements and make adjacent ones operate reverse logic operations to each other for preventing the simultaneous driving of the adjacent exothermic resistors 1. The same symbols are given to the parts in FIG. 11 which are similar to those in FIG. 8 and the explanation of them is omitted.

Figure 13:
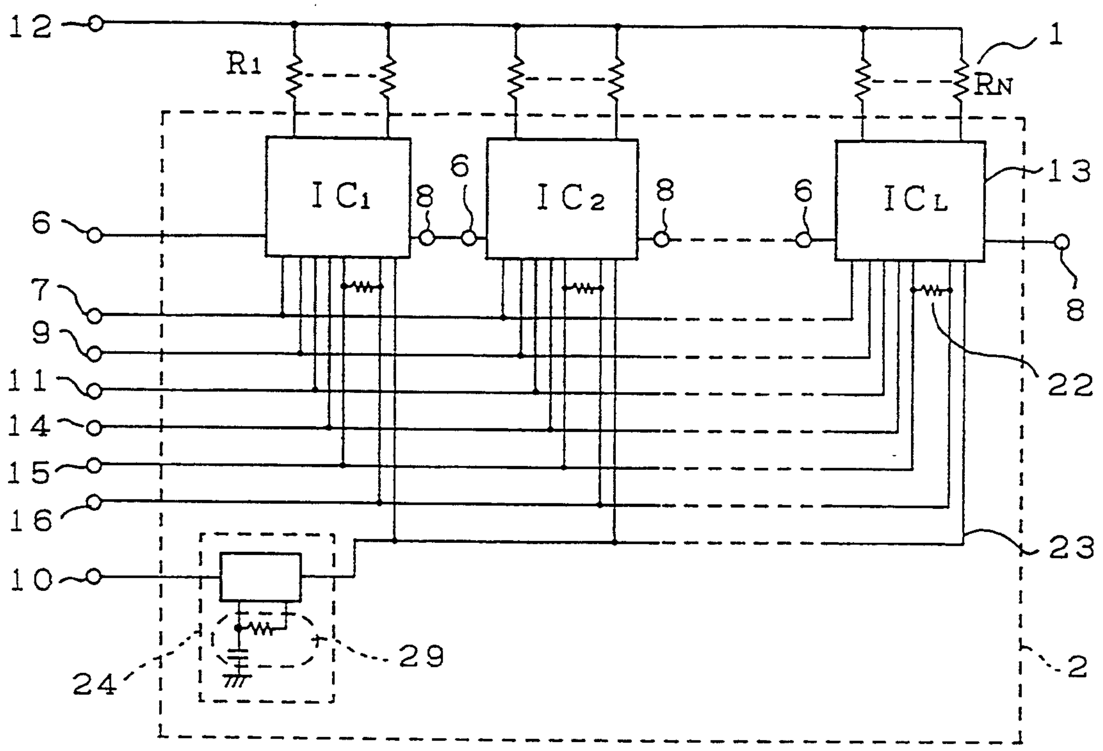
FIG. 13 is a circuit diagram of a thermal head as an electronic part realized in the above-mentioned embodiment 8.

FIG. 13 is a circuit diagram of a thermal head, an example of an electronic part which is actually manufactured based on the circuit shown in FIG. 12, and as in a conventional case, it is constituted, for example, by connecting 27 IC's 13 each made up of 64 bits.

Each of these IC's 13 is connected to a clock pulse terminal 7, a latch terminal 9, a strobe terminal 10, a BEO terminal 11, an all-on terminal 16, a power supply 14 and a grounding terminal 15, and an output terminal 8 of the previous stage is connected to an input terminal 6 of the next stage for N stages; for example, in the case of a thermal head of A4 size of 8 bits per mm, the circuit is constituted with shift registers and latch circuits of 1728 bits, and the number of exothermic resistors is 1728.

Part 22 is a pull-down resistor connected to the all-on terminal 16 and the grounding terminal 15, and it is connected to each of these IC's 13. The above-mentioned constitution can be easily achieved by forming a film resistor composed of polysilicon, for example, between an aluminum wiring to the all-on terminal 16 and to the grounding terminal 15 in an IC, for example, when IC's 13 are manufactured. The resistance value of the resistor to be formed is roughly in the range of 50 kΩ to 200 kΩ, and the total pull-down resistance value between the all-on terminal 16 and the grounding terminal is roughly 1.85 kΩ to 7.4 kΩ, and it can be operated by the output of an ordinary logic IC.

It is desirable to connect a pull-down resistor 22 to each of these IC's for a safety measure against the breakage of a connecting wire to the IC 13, but it is not a necessary condition. Part 23 is an FCON signal based on the output signal of an oscillator circuit 24, and the oscillation frequency can be changed with the change in connecting elements such as a resistor, a capacitor, etc. in the oscillator circuit 24.

Figure 14:
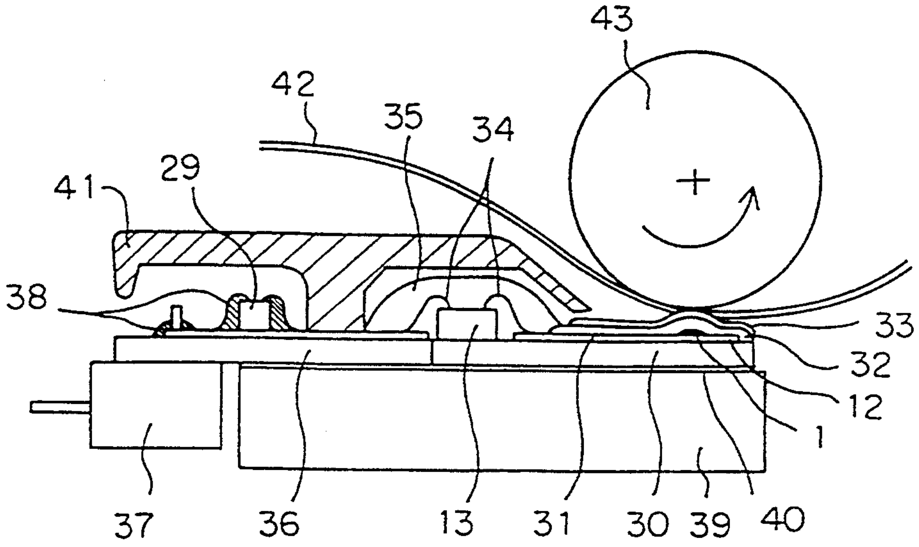
FIG. 14 is a cross sectional view of the thermal head.

FIG. 14 shows a thermal head realized based on the connection diagram shown in FIG. 13; in the figure, 30 is a substrate (hereinafter referred to as an exothermic substrate) which is, for example, a ceramic substrate of alumina having the purity of about 96% covered with glass, and over the substrate a conductor pattern 31 is formed for forming exothermic resistors 1 and a common electrode 12, and further a protective film 32 and a high resistance film 33 are attached over it. IC's 13 are disposed over the exothermic substrate 30 and they are connected to the conductor pattern 31 by gold wire bondings.

Part 36 is a printed board, and the input signal leads of IC's 13, etc. are also connected to the printed board 36 with gold wires 34, and the pattern of the printed board is extended to the connecting part of a connector 37 which is the connecting part of the thermal head to an external connecting cable, and the printed board 36 and the connector 37 are connected to each other with solder 38. Element 35 is a protective resin film for protecting the IC's 13 and the gold wires 34, and 29 is a connected element for the oscillator circuit 24 such as chip resistors, chip capacitors, etc., for example, being fixedly connected on the printed board 36 with solder 38.

Part 39 is a supporting base for the exothermic substrate 30 and the printed board 36 and it is formed with, for example, aluminum or iron, 40 is double faced adhesive tape for fixing the exothermic substrate and the printed board 36 on the supporting base 39, 41 is a cover to be a guide for conveying heat sensitive paper 42, and 43 is a platen roller for conveying the heat sensitive paper 42 being positioned above the exothermic resistors 1.

In this case, the high resistance film 33 can be omissible, but it has the effect of preventing static charge build up on the heat sensitive paper 42 during the paper movement, and it is connected to the common electrode or to the grounding terminal 15 at a position not shown in a drawing. The heat accumulation of an exothermic resistor varies greatly, depending on the material or dimensions such as thickness of the exothermic substrate 30, the common electrode 12, the conductor pattern 31, the protective film 32, and the high resistance film 33, and also it varies depending on the constitution of the exothermic resistors 1.

Figure 15:
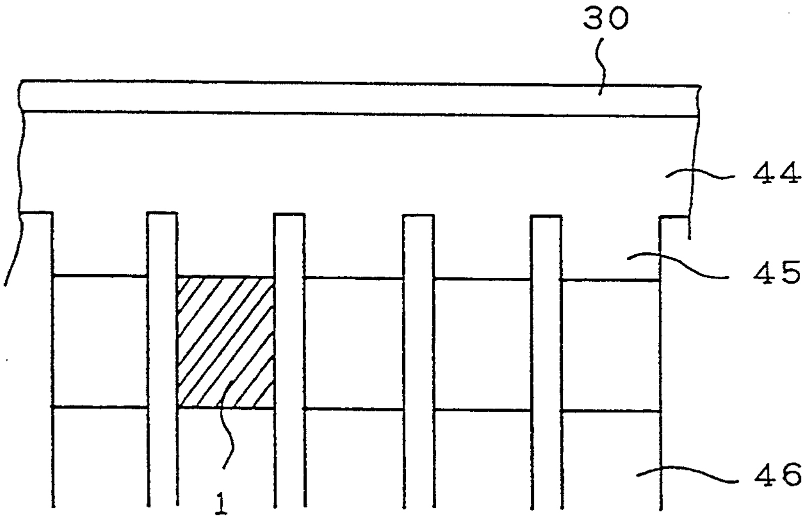
FIG. 15 is a partial plan view showing an example of a principal part of an exothermic resistor of the above-mentioned thermal head.
Figure 16:
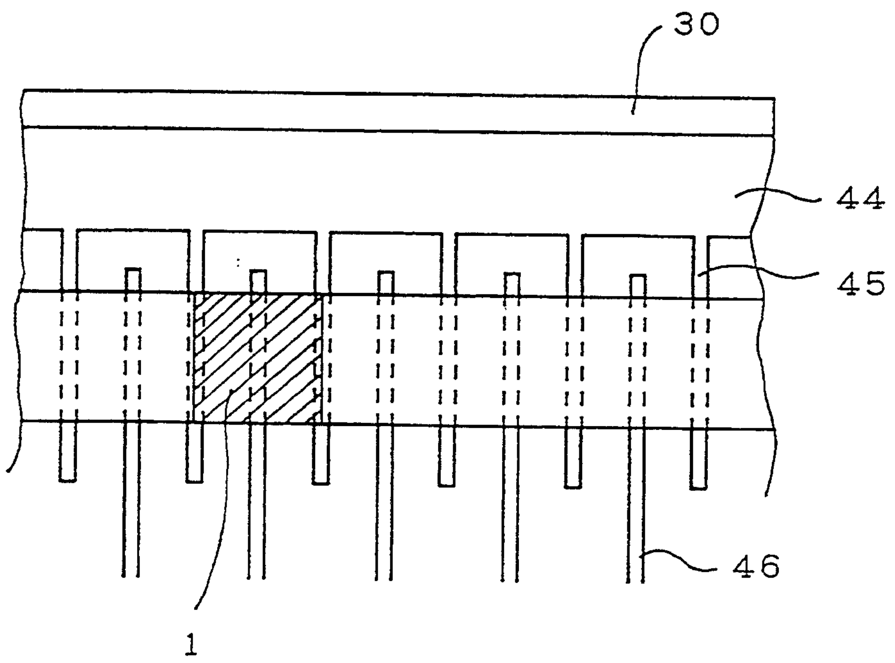
FIG. 16 is a partial plan view showing another example of a principal part of an exothermic resistor of the above-mentioned thermal head.
Figure 17:
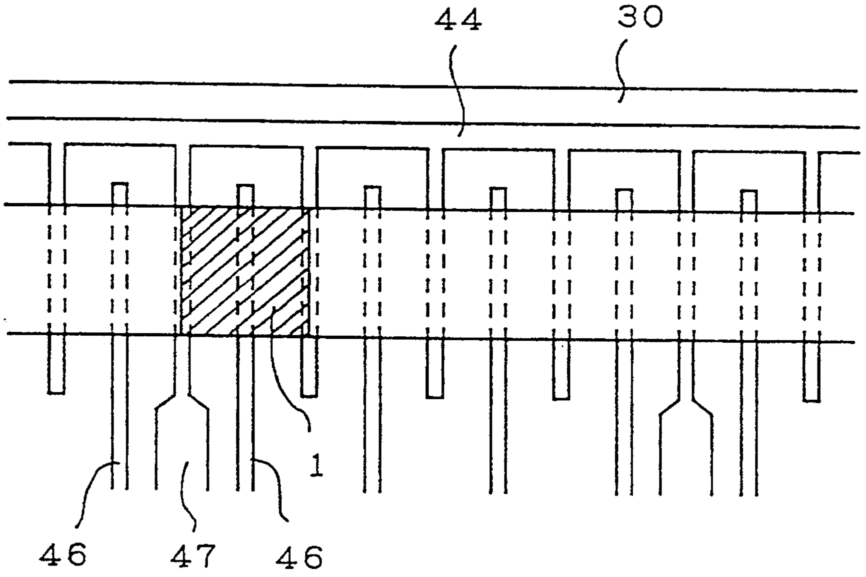
FIG. 17 is a partial plan view showing a further example of a principal part of an exothermic resistor of the above-mentioned thermal head.

FIGS. 15 to 17 are partial plan views showing a principal part of the disposition of exothermic resistors 1; 44 is a common electrode pattern to be the common electrode 12, 4 5 are common electrode leads, 46 are individual electrode leads to be connected to the switching elements, and 47 are common electrode leads disposed between the individual electrode leads being common electrode return leads. FIG. 15 shows a thin film thermal head, and FIG. 16 and FIG. 17 show thick film thermal heads.

In the case of a thin film thermal head shown in FIG. 15, the film constitution of the exothermic substrate 30 becomes a resistor film and a conductor film. From these films independent exothermic resistors 1 are formed using photoengraving and etching. The influence on the picture quality caused by accumulation and conductance of heat to the adjacent elements of the exothermic resistors 1 is decided by the heat resistance and the heat capacitance of a separating section, but the order of the influence is small in comparison with that in the case of a continuous resistor body of belt shaped thick film paste as shown in FIGS. 16 and 17.

In the case of a thick film thermal head shown in FIGS. 16 and 17, the film constitution of the exothermic substrate 30 becomes a conductor film and a belt shaped continuous resistor body, and after the conductor film is formed into a comb shaped pattern in which common electrode leads 45 and individual leads 46 are arranged alternately using the technologies of photoengraving and etching, a belt shaped continuous resistor body is formed in applying a thick film paste of ruthenium oxide, etc. by printing or direct writing in order to form the exothermic resistors 1. In the case of FIG. 16, the common electrode pattern 44 is wider than that in the case of FIG. 17.

In the case of a thermal head as described in the above, when it is desired to see the printing result on heat sensitive paper 42 immediately, the closer the position of the exothermic resistors 1 to the edge of the exothermic substrate, the sooner the printing result can be seen. The distance is decided by the width of the common electrode pattern 44. The width of the common electrode pattern 44 constitutes a resistance component of wiring and it is decided to be in an order not to influence picture quality, and in some cases it is also possible to make the width of the common electrode pattern 44 narrow and the pattern resistance is reinforced in the direction of thickness. The thickness is limited so as not to influence the conveyance of heat sensitive paper.

FIG. 17 shows a case where resistance reinforcement of the conductor pattern is not executed, and the common electrode return leads 47 are so disposed and formed that the common electrode leads 45 are disposed on the side of the individual electrode leads 46 at intervals of several bits, and they are commonly connected on the side of the individual electrode leads 46.

Figure 18:
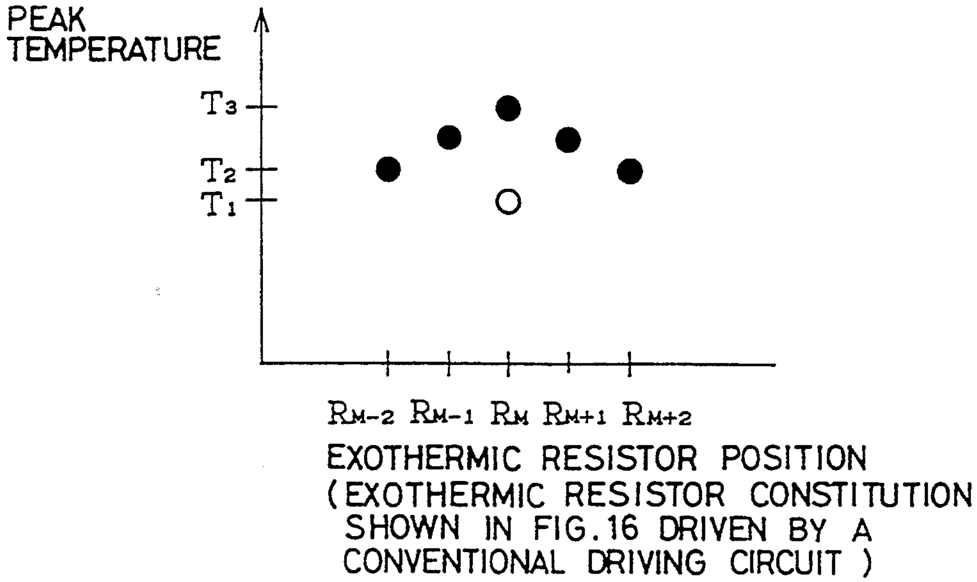
FIG. 18 is an illustrative representation showing peak temperatures in a case where the exothermic resistors shown in FIG. 16 are driven by a conventional driving circuit.
Figure 19:
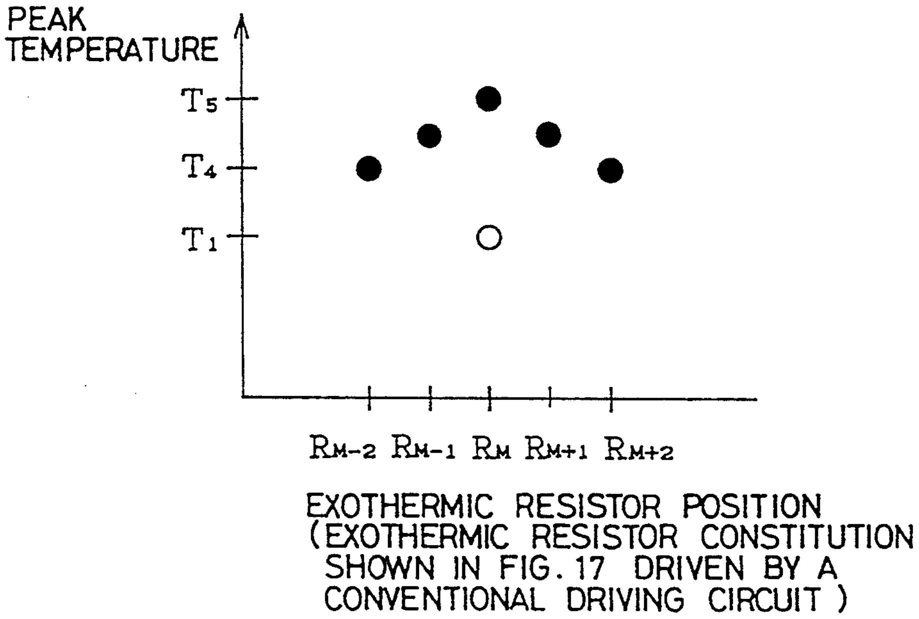
FIG. 19 is an illustrative representation showing peak temperatures in a case where the exothermic resistors shown in FIG. 17 are driven by a conventional driving circuit.

The results of investigation of peak temperatures of the exothermic resistors 1 shown in FIGS. 16 and 17 are shown in FIGS. 18 and 19. FIG. 18 shows the result of the case shown in FIG. 16, and FIG. 19 shows the result of the case shown in FIG. 17; these are the results of measurement of a peak temperature of an exothermic resistor when only one resistor was energized and a peak temperature of an exothermic resistor when 5 consecutive exothermic resistors were energized with a thermometer in an arrangement where the printing period was 10 ms, the pulse applied period of time (switching period of time of exothermic resistors) was 5 ms, the resistance value of an exothermic resistor was 3000 Ω, the applied voltage to the common electrode was 14V, and a conventional driver was used. In the figure, o marks show the case where one exothermic resistor was energized, and • marks show the case where 5 consecutive exothermic resistors were energized.

$T_1$ is 120° C., $T_2$ is 130° C. and $T_3$ is 150° C., and in the case where the consecutive exothermic resistors were energized, the temperature of the central resistor was 30° C. higher than that in the case where one resistor is energized. Further in the case where the common electrode pattern was made small, $T_4$ is 140° C. and $T_5$ is 160° C., and the difference became as large as 40° C. It is presumed that the heat dissipation due to the conduction to the exterior through a conductor, the common electrode pattern 44, was decreased.

Figure 20:
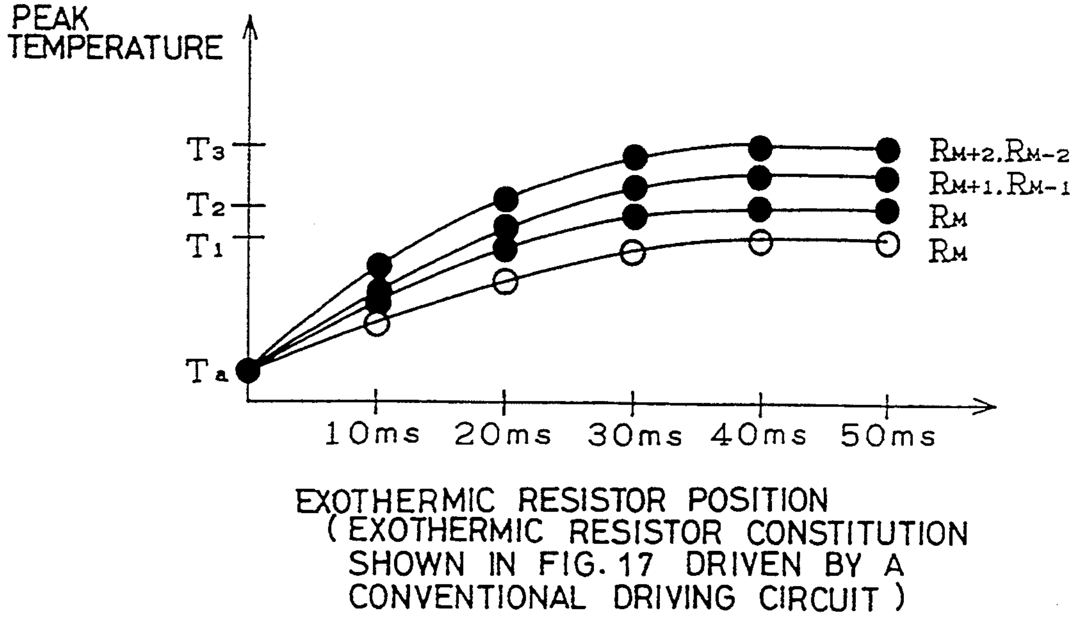
FIG. 20 is an illustrative representation showing peak temperatures measured in every 10 ms in a case where the exothermic resistors shown in FIG. 17 are driven by a conventional driving circuit.

FIG. 20 is a diagram showing peak temperatures measured every 10 ms using exothermic resistors having the constitution as shown in FIG. 17, and o marks show the case where one exothermic resistor was energized and • marks show the case where 5 consecutive exothermic resistors were energized. In the figure, $T_a$ was 25° C. and the peak temperatures saturated in 40 ms; such phenomena as described in the above were the causes of degradation of picture quality.

Figure 21:
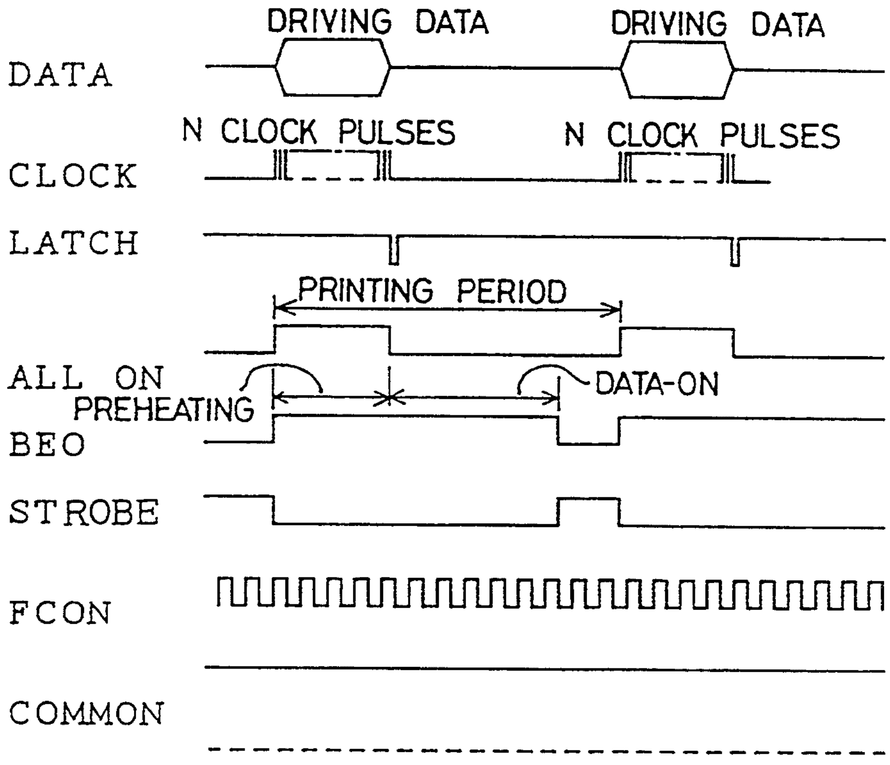
FIG. 21 is a timing chart showing an example of the operation in the above-mentioned embodiment 8.

Another measurement was made with the use of exothermic resistors having the constitution as shown in FIG. 17 and the driving circuit as shown in FIG. 12 in which the resistance of an exothermic resistor was made to 1500 Ω and printing period was 10 ms, and the exothermic resistors were driven at the timing as shown in FIG. 21. The peak temperature of an exothermic resistor when 1 exothermic resistor was energized and the peak temperatures of exothermic resistors when 5 consecutive exothermic resistors were energized were measured with an infrared surface thermometer making a preheating time 4 ms, data-on time 5 ms, the oscillation frequency of the oscillator circuit 2420 kHz, and the applied voltage to the common electrode 14V.

Figure 22:
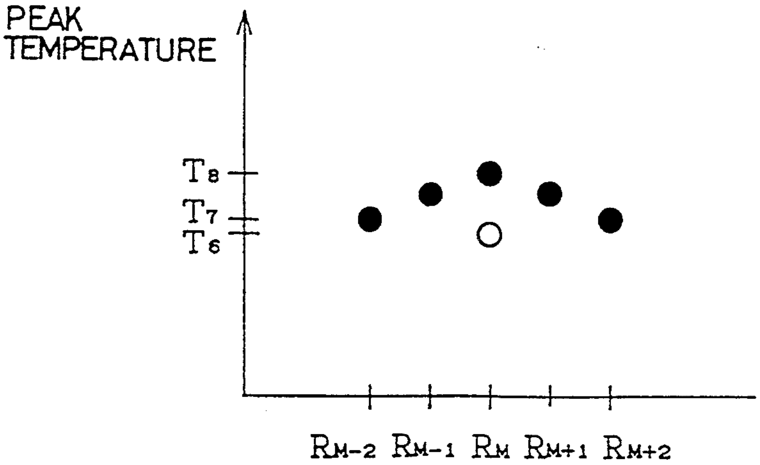
FIG. 22 is an illustrative representation showing peak temperatures in a case where the exothermic resistors shown in FIG. 17 are driven by the driving circuit shown in the above-mentioned embodiment 8.
Figure 23:
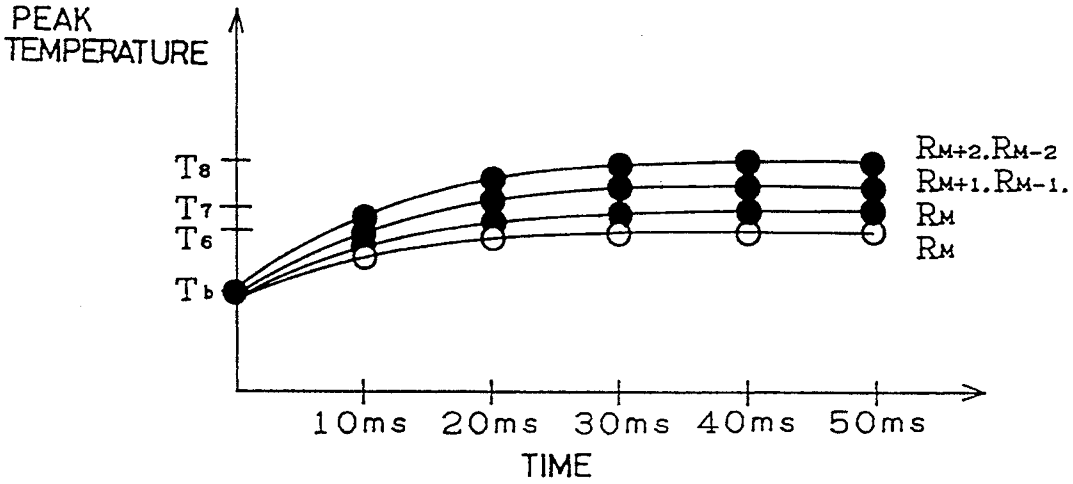
FIG. 23 is an illustrative representation showing peak temperatures measured in every 10 ms when the exothermic resistors shown in FIG. 17 are driven by the driving circuit shown in the above-mentioned embodiment 8.

The result is shown in FIG. 22. $T_6$ was 130° C., $T_7$ was 135° C. and $T_8$ was 145° C.; thus the temperature difference was made small. Further, peak temperatures measured every 10 ms are shown in FIG. 23, and $T_b$ was 70° C., $T_6$ was 130° C., $T_7$ was 135° C. and $T_8$ was 145° C. The peak temperatures saturated in 20 ms to 30 ms, and good picture quality, hence degradation in picture quality was prevented.

Figure 24:
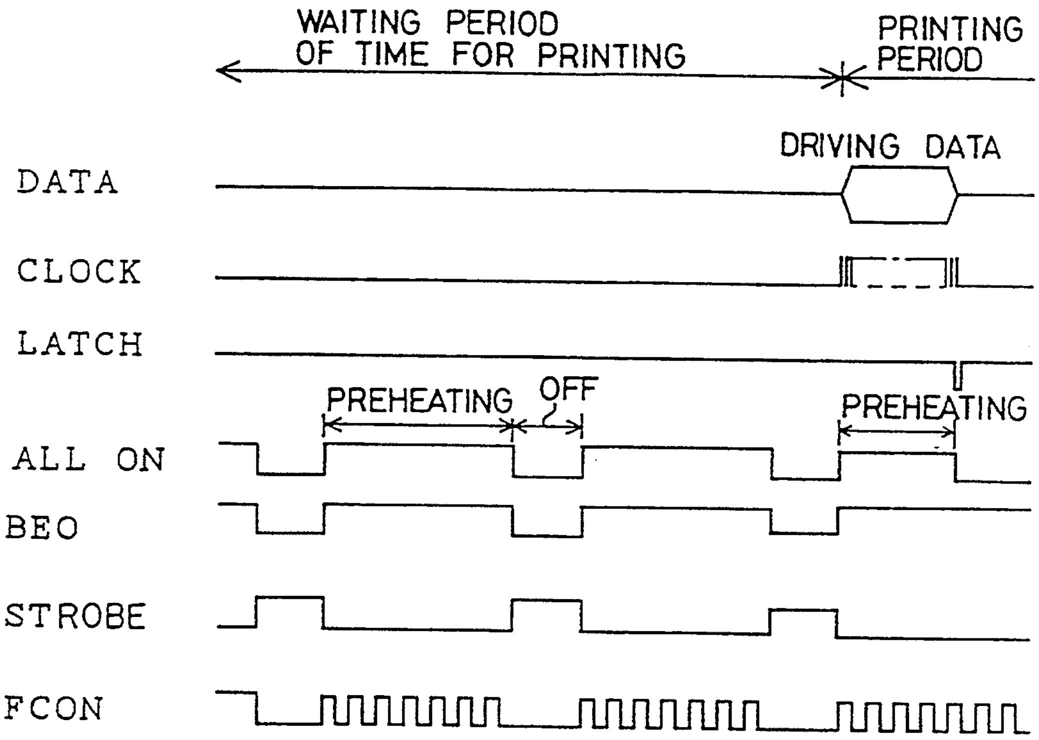
FIG. 24 is a timing chart showing another operation example in the above-mentioned embodiment 8.

FIG. 24 is a timing chart showing that preheating can be performed during a waiting time for printing by an all-on signal (ALL ON), and owing to such a control it is possible to raise the resistance value of the exothermic resistor and decrease current consumption. The temperature of preheating is decided to be lower than the coloring temperature of a heat sensitive paper, and preheating time is not limited. An FCON signal can be an intermittent pulse waveform as shown in FIG. 24.

In the above-mentioned embodiment, switching is performed in the logic states of an H level and an L level of the FCON signal, but to avoid the switching to be performed simultaneously with the logic switching time, it is desirable to shift the starting time of switching from the cutoff time; it is easy to delay the starting time by 0.5 μs and the cutoff time by 3 μs for an IC which can be the manufacturing structure of a CMOS. The frequency of an FCON signal is decided based on the switching velocity, and for the countermeasure against EMI, it is desirable to make the frequency lower than 500 kHz.

Figure 25:
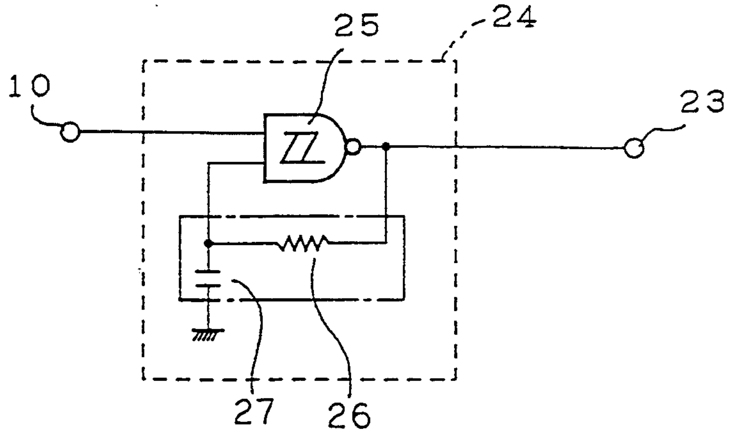
FIG. 25 is a circuit diagram showing an example of the oscillator circuit used in the above-mentioned embodiment 8.
Figure 26:
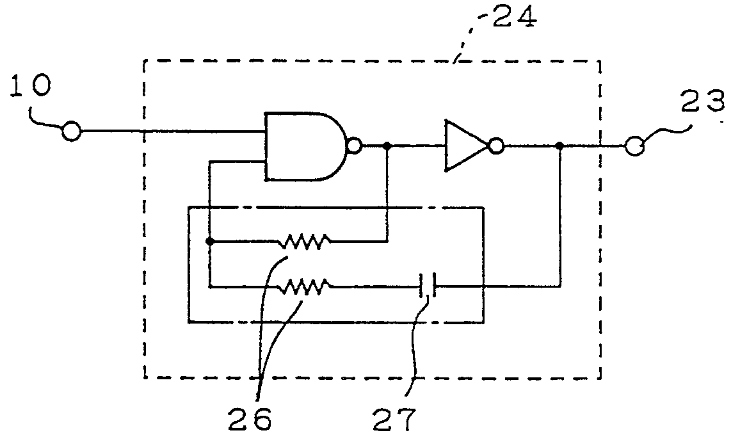
FIG. 26 is a circuit diagram showing another example of the oscillator circuit used in the above-mentioned embodiment 8.
Figure 27:
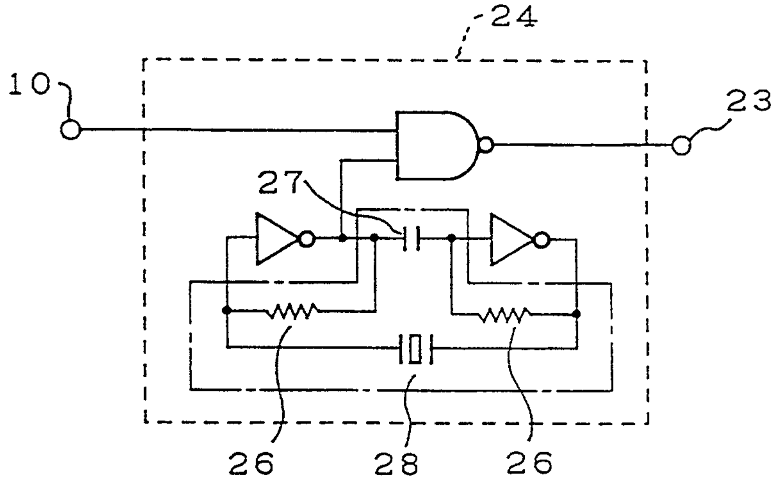
FIG. 27 is a circuit diagram showing a further example of the oscillator circuit used in the above-mentioned embodiment 8.

The oscillator circuit 24 can use a Schmitt trigger circuit 25, a resistor 26 and a capacitor 27 as shown in FIG. 25; it can use an arrangement in which a NAND circuit and an inverter are connected in series and the inverter output is fed back with the capacitor 27 and the resistor 26 as shown in FIG. 26; or it can use an arrangement in which an assembled part 29 composed of a quartz resonator 28, a resistor 26 and a capacitor 27 is mounted on a printed board 36 and it is connected to a NAND gate, inverter, etc. In this case, when chip elements are used it can be mounted on a printed board easily with solder. From the point of view of measures against EMI, it is desirable that the oscillator 24 is a built-in oscillator inside a thermal head.

Embodiment 9

Figure 28:
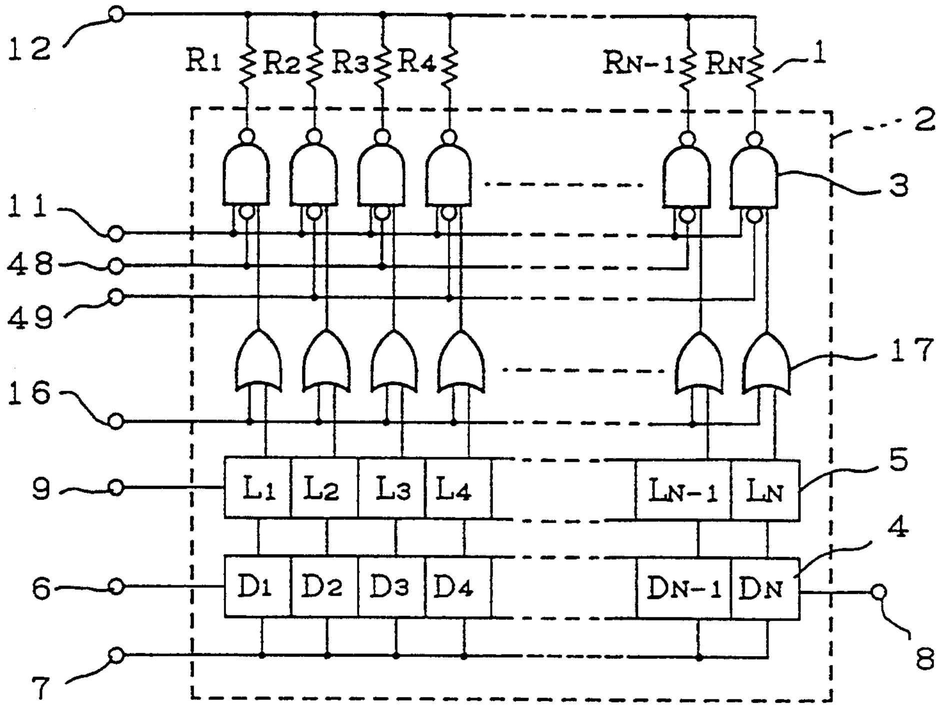
FIG. 28 is a circuit diagram showing an embodiment 9 according to the present invention.

FIG. 28 is a circuit diagram showing an embodiment in the sixth aspect of the present invention. In the figure, 48 is a strobe terminal corresponding to odd number bits and 49 is a strobe terminal corresponding to even number bits, and the other parts are similar to those in the embodiment 8. In this case, it is possible to arrange in such a way that in the case of preheating, heat can be accumulated more in making both strobe signals at the strobe terminals 48 and 49 into an L level, and only in the case of data-on, are odd number bits and even number bits switched alternately.

Embodiment 10

Figure 29:
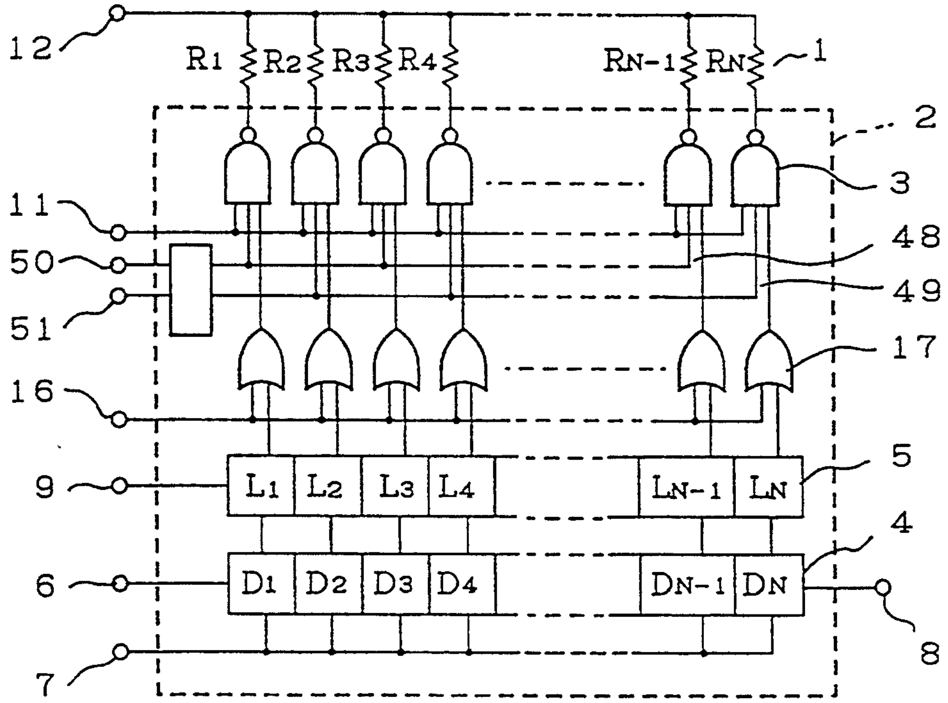
FIG. 29 is a circuit diagram showing an embodiment 10 according to the present invention.

FIG. 29 is a modified circuit example of the circuit shown in FIG. 28, and 50 is a PSTB to be a pulse signal or a conventional strobe signal, and 51 is a control signal for selecting a pulse input or a strobe signal input.

Embodiment 11

In the above-mentioned embodiments, explanation is given about the case where a driven element is an exothermic resistor and a switching element is a current absorbing type circuit, but the driven element can be a plasma emitter and a switching element can be a voltage outputting type circuit; a circuit using these elements has a similar effect to that of the above-mentioned embodiments, and the polarity of a driven element or that of a switching element is not limited.

As mentioned in the above, according to the first aspect of the present invention the arrangement is so constituted that the signal information for driving driven elements independent of the driving information held in a holding means can be supplied to the switching elements, so that there is an effect that a driving circuit can be obtained in which the transmittance of the signal information for preheating is not needed.

According to the second aspect of the present invention, the arrangement is so constituted that a driving time for driving driven elements is decided by at least 2 kinds of driving period of time decision signals which operate opposing logic operations to each other, so that an erroneous operation in an unstable period of signal time at the ON/OFF of the power supply, can be prevented.

According to the third aspect of the present invention, the arrangement is so constituted that the driven elements which correspond to the driving information from the holding means are driven by the use of switching elements which perform switching operations to make adjacent ones perform opposing logic operations to each other according to driving time decision signals; thereby there is an effect that the adjacent driven elements are not heated simultaneously and a driving circuit in which degradation of picture quality caused by heat accumulation or heat conductance is small can be obtained.

According to the fourth aspect of the present invention, the arrangement is so constituted that a pulse signal having a logic state where the adjacent driven elements are not driven simultaneously is made to be a driving time decision signal; thereby there is an effect that the degradation in picture quality can be prevented.

According to the fifth aspect of the present invention, the arrangement is so constituted that the switching elements with which the adjacent ones operate opposing logic operations to each other according to the driving period of time decision signals are used and the signal information for driving driven elements independent of the driving information is supplied to the switching elements; thereby there is an effect that the transmission of signal information for preheating is not needed, and the adjacent driven elements are not heated simultaneously, which makes it possible to obtain a driving circuit in which degradation of picture quality caused by heat accumulation or heat conductance is small.

According to the sixth aspect of the present invention, the arrangement is so constituted that the driven elements are divided into groups so that the adjacent driven elements are not incorporated in the same group and the switching elements are used which operate according to the driving period of time decision signals for deciding the driving periods of time of respective groups and the signal information for driving driven elements independent of the driving information is supplied to the switching elements; thereby there is an effect that the transmission of the signal information for preheating is not needed, and adjacent driven elements are not heated simultaneously, which makes it possible to obtain a driving circuit in which degradation of picture quality caused by heat accumulation or heat conductance is small.

According to the seventh aspect of the present invention the arrangement is so constituted that the driving period of time decision signals are decided based on the logic state of a pulse signal from a pulse generation means. Thereby there is the effect that the supply of an FCON signal from the exterior is not needed.

According to the eighth aspect of the present invention, the arrangement is so constituted that a resistor is connected between an input terminal of the signal information and the power supply terminal or the grounding terminal according to the logic state of the signal information from the signal information supply means; thereby there is an effect to be able to prepare safety measures against a wiring breakage.

What is claimed is:

1. A driving circuit comprising:

a holding means for holding serial signal information comprising first driving signal information for a respective number of driven elements and for outputting said first driving signal information in parallel;

a number of switching elements coupled to the respective driven elements and to the holding means for receiving said first driving signal information from said holding means and for performing switching operations according to said first driving signal information for controlling the driving periods of time for said driven elements and supplying said first driving signal information output from said holding means to said driven elements for driving them; and a signal information supply means for supplying to said switching elements second driving signal information independently of said first driving signal information for driving said driven elements independently of the said first driving signal information.

2. A driving circuit described in claim 1 wherein there are at least two kinds of said first driving signal information which operate with opposing logic operations with respect to each other.

3. A driving circuit described in claim 1 wherein a resistor is connected between an input terminal of the signal information and either a power supply or grounding terminal, according to a logic state of the signal information to be supplied by the said signal information supply means.

4. A driving circuit described in claim 2 wherein a resistor is connected between the input terminal of the signal information and either of the power supply or grounding terminals.

5. A driving circuit comprising:

a holding means for holding serial signal information comprising driving signal information for a respective number of driven elements and for outputting said driving signal information in parallel; and a number of switching elements connected to the said driven elements respectively for operating switching operations and making the adjacent ones of said switching operations operate with opposing logic operations with respect to each other according to said driving signal information for controlling driving periods of time for the said driven elements, and for supplying said driving signal information output from said holding means to the corresponding driven elements for driving them.

6. A driving circuit described in claim 5 wherein the said driving signal information comprises a pulse signal having a logic state where the adjacent said driven elements are not driven simultaneously.

7. A driving circuit comprising:

a holding means for holding serial signal information comprising first driving signal information for a respective number of driven elements and for outputting said first driving signal information in parallel;

a number of switching elements for operating switching operations for making the adjacent ones of said switching operations operate with logic operations opposite to each other according to said first driving signal information for controlling the driving periods of time for said driven elements, and for supplying the said first driving signal information output from said holding means to said driven elements for driving them; and a signal information supply means for supplying to said switching elements second driving signal information independently of said first driving signal information for driving said driven elements independently of the said first driving signal information.

8. A driving circuit described in claim 5 wherein a pulse signal generation means is further provided for generating a pulse signal for controlling said driving periods of time based on the logic state of the pulse signal.

9. A driving circuit described in claim 6 wherein a pulse signal generation means is further provided for generating a pulse signal for controlling said driving periods of time based on the logic state of the pulse signal.

10. A driving circuit described in claim 7 wherein a pulse signal generation means is further provided for generating a pulse signal for controlling said driving periods of time based on the logic state of the pulse signal.

11. A driving circuit comprising:

a holding means for holding serial information comprising first driving signal information for a number of driven elements and for outputting said first driving signal information in parallel;

a plurality of switching elements individually connected to the driven elements, the driven elements being divided into groups separating the adjacent driven elements into different groups, said switching elements being coupled to said holding means for receiving said first driving signal information from said holding means for operating switching operations according to said first driving signal information for controlling the driving periods of time for said different groups, and for supplying said first driving signal information output from said holding means to the corresponding said driven elements for driving them; and and a signal information supply means for supplying to said switching elements second driving signal information independently of said first driving signal information for driving said driven elements independently of the said first driving signal information.

12. A driving circuit described in claim 11 wherein a pulse generation means is further provided for generating a pulse signal for controlling said driving period of time based on the logic state of the pulse signal.

13. A driving circuit described in claim 7 wherein a resistor is connected between an input terminal for the signal information and either a power supply terminal or a grounding terminal according to the logic state of the signal information supplied by the said signal information supply means.

14. A driving circuit described in claim 11 wherein a resistor is connected between the input terminal for the signal information and either the power supply terminal or the grounding terminal according to the logic state of the signal information supplied by the said signal information supply means.

15. A driving circuit described in claim 8 wherein a resistor is connected between the input terminal for the signal information and either the power supply terminal or the grounding terminal according to the logic state of the signal information supplied by the said signal information supply means.

16. A driving circuit described in claim 9 wherein a resistor is connected between the input terminal for the signal information and either the power supply terminal or the grounding terminal according to the logic state of the signal information supplied by the said signal information supply means.

17. A driving circuit described in claim 10 wherein a resistor is connected between the input terminal for the signal information and either the power supply terminal or the grounding terminal, according to the logic state of the signal information supplied by the said signal information supply means.

18. A driving circuit described in claim 12 wherein a resistor is connected between the input terminal for the signal information and either the power supply terminal or the grounding terminal according to the logic state of the signal information supplied by the said signal information supply means.

* * * * *

UNITED STATES PATENT AND TRADEMARK OFFICE
CERTIFICATE OF CORRECTION

PATENT NO. : 5,349,623

DATED : September 20, 1994

INVENTOR(S) : Hiroshi Itoh

It is certified that error appears in the above-identified patent and that said Letters Patent is hereby corrected as shown below:

Col. 4, line 29, "Switching" should be --switching--.

Col. 5, line 39, after "embodiment" insert --1--.

Col. 5, line 41, after "embodiment" insert --2--.

Col. 5, line 43, after "embodiment" insert --3--.

Col. 5, line 45, after "embodiment" insert --4--.

Col. 5, line 47, after "embodiment" insert --5--.

Col. 5, line 49, after "embodiment" insert --6--.

Col. 5, line 51, after "embodiment" insert --7--.

Col. 5, line 53, after "embodiment" insert --8--.

Col. 10, line 30, "4 5" should be --45--.

Signed and Sealed this

Twenty-eight Day of February, 1995

*Attest:*

BRUCE LEHMAN

*Attesting Officer*

*Commissioner of Patents and Trademarks*